United States Patent [19]
Nam

[11] Patent Number: 6,051,477
[45] Date of Patent: Apr. 18, 2000

[54] METHOD OF FABRICATING SEMICONDUCTOR DEVICE

[75] Inventor: Chul-Woo Nam, Seoul, Rep. of Korea

[73] Assignee: Hyundai Electronics Industries Co., Ltd., Kyoungki-do, Rep. of Korea

[21] Appl. No.: 08/734,920

[22] Filed: Oct. 22, 1996

[30] Foreign Application Priority Data

Nov. 1, 1995 [KR] Rep. of Korea ................. 95-39164

[51] Int. Cl.⁷ ................................................. H01L 21/76
[52] U.S. Cl. ............................ 438/404; 438/633; 438/637; 438/645; 438/692; 438/778
[58] Field of Search ................................ 438/406, 459, 438/460, 479, 404, 622, 402, 476, 633, 637, 645, 692, 778

[56] References Cited

U.S. PATENT DOCUMENTS

| 5,212,114 | 5/1993 | Grewal et al. | 437/192 |
| 5,229,331 | 7/1993 | Doan et al. | 437/228 |
| 5,234,535 | 8/1993 | Beyer et al. | 156/630 |
| 5,413,952 | 5/1995 | Pages et al. | 438/406 |
| 5,449,638 | 9/1995 | Hong et al. | 438/406 |
| 5,646,053 | 7/1997 | Schepis et al. | 438/476 |

FOREIGN PATENT DOCUMENTS 4-67634  3/1992  Japan .

OTHER PUBLICATIONS

English translation of Abstract for JP 04–67634 (Mar. 3, 1992).

*Primary Examiner*—David Nelms
*Assistant Examiner*—Reneé R. Berry
*Attorney, Agent, or Firm*—Ware, Fressola, Van Der Sluys & Adolphson LLP

[57] ABSTRACT

A method of fabricating a SOI wafer is disclosed, which comprises the steps of: providing a silicon-on-insulator wafer wherein an oxide is formed between a base substrate and a devise substrate; thinning the device substrate to form a Si layer; etching the Si layer to expose the surface of the oxide film, to form trenches; forming polishing stoppers within the trenches, each polishing stopper have a smaller thickness in its center portion and a greater thickness in its outer portion; heat-treating the polishing stopper; and polishing, via chemical and mechanical polishing, the Si layer using the polishing stopper to form a device formation layer.

16 Claims, 3 Drawing Sheets

METHOD OF FABRICATING SEMICONDUCTOR DEVICE

BACKGROUND OF THE INVENTION

The present invention relates to a method of fabricating a semiconductor device, and more particularly to a method of fabricating a SOI wafer having a device formation layer of a planar surface.

In general, a silicon-on-insulator ("SOI") wafer has advantages of complete isolation, low parasitic capacitance and high speed performance. Such a SOI wafer comprises a base substrate, a Si substrate on which the device is formed (Hereinafter, refer to a device substrate), and an insulator formed between the aforementioned substrates.

There are two methods for the fabrication of the SOI wafer, a separation by implated oxygen("SIMOX") method and a bonding method. The SIMOX method implants oxygen ions into a Si substrate to form SOI wafer. In the bonding method, the device substrate on which an insulator is formed is bonded to the base substrate, and the device substrate is then thinly ground to form the SOI wafer. The SIMOX method has a disadvantage that it is difficult to control the thickness of the device substrate and generated defects in surface of the device substrate. Accordingly, the bonding method is typically used in the fabrication of the SOI wafer.

FIG. 1A through FIG. 1C are sectional views illustrating a method of fabricating a SOI wafer having a device formation layer by a prior bonding method. As shown in FIG. 1A, a device substrate 10 on which a first oxide film 11 is formed, and the first oxide film 11 is bonded by thermal oxidation to a base substrate 20 by a conventional method. As shown in FIG. 1B, the device substrate 10 is ground to the predetermined thickness, for example 9–12 $\mu$m to form a Si layer 13. Then, the predetermined portions of the Si layer 13 are etched to expose the first oxide film 11, thereby forming trenches T. A second oxide film 14 is then uniformly deposited over the resultant by a CVD method and then patterned to be remained within the trenches T.

As shown in FIG. 1C, the remaining Si layer 13 is polished by a CMP method using the patterned second oxide film 14 as a polishing stopper to form a device formation layer 13-1, thereby fabricating a SOI wafer.

According to the prior art, in polishing the Si layer 13, a polishing pad of a polisher is contacted with the Si layer 13 and the second oxide film 14 which have a different polishing rates to cause the shaped of the pad to be deformed. Accordingly, in polishing the Si layer 13 and the second oxide film 14 at the same time, when the polishing pad contacts the second oxide film 14, the pressure applied to the polishing pad is concentrated to the second oxide film which has a lower polishing rate. Thus, the increased friction of the contact between the polishing pad and the second oxide film 14 causes the polishing pad to slow and stop, and the polishing of the Si layer to be automatically finished.

However, as the shape of the polishing pad is deformed during polishing of the second oxide film, dishing of the Si layer occurs wherein the Si layer is ground so as to be thinner in its central portion as shown in FIG. 1C. Accordingly, it is difficult to adapt the SOI wafer where dishing has occurred to the complete depletion type CMOS transistor that requires the thickness of the SOI wafer to be 1000 Å within a precise range of ±10%. Furthermore, the process becomes complicated due to separate removal of the second oxide film used as a polishing stopper.

SUMMARY OF THE INVENTION

An object of the present invention is to provide a method, of fabricating a SOI wafer, which forms a device formation layer having an even surface using a CMP process.

In accordance with one embodiment, there is provided a method of fabricating a SOI wafer, comprising the steps of: providing a silicon-on-insulator wafer wherein an oxide is formed between a base substrate and a device substrate; thinning said device substrate to form a Si layer; etching said Si layer to expose the surface of said oxide film, thereby forming trenches; forming polishing stoppers within said trenches, each polishing stopper have a smaller thickness in its center portion and a greater thickness in its outer portion; heat-treating said polishing stopper; and polishing, via chemical and mechanical polishing ("CMP"), said Si layer using said polishing stopper to form a device formation layer.

In the embodiment, said step for thinning said device substrate includes the step for grinding said Si layer; and polishing the ground surface of said Si layer via chemical and mechanical polishing.

In the embodiment, said step for thinning said device substrate includes the step for wet etching said Si layer; and polishing the ground surface of said Si layer via mechanical and chemical polishing.

In the embodiment: said device substrate is ground so that thickness of said Si layer is less than 2 $\mu$m; said trench has a width of 100 $\mu$m–1 mm; and the width of said Si layer between trenches is 2—10 mm. In the embodiment, said polishing stopper comprises either a silicate SOG or a PSG containing $P_2O_5$. In the embodiment, the thickness of said Si layer is controlled in accordance with the thickness of said polishing stopper in the central portion of said trench, the thickness of said polishing stopper being 300–500 Å. In the embodiment, the step for heat-treating said polishing stopper is carried out in a temperature of 400–600° C.

In the embodiment, the step for providing said silicon-on-insulator wafer includes the steps of providing said device substrate on which said oxide film is formed, and said base substrate; contacting the surface of said oxide film with the surface of said base substrate; and bonding said base substrate and said device substrate at a high temperature and a high pressure.

In the embodiment, the step for providing said silicon-on-insulator wafer includes the steps of providing said base substrate which said oxide film is formed thereon and said device substrate; contacting the surface of said oxide film with said device substrate; and bonding said base substrate and said device substrate at a high temperature and a high pressure.

BRIEF DESCRIPTION OF THE DRAWINGS

The objects and feature of the invention may be better understood with reference to the following detailed description, appended claims, and attached drawings wherein:

DETAILED DESCRIPTION OF THE INVENTION

Figure 2A:
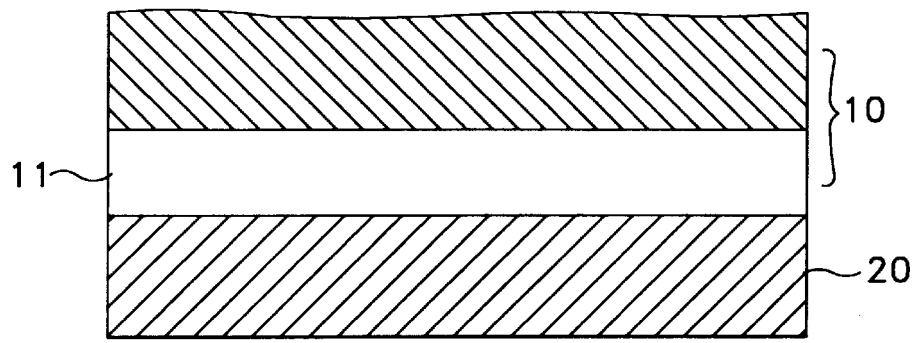
FIG. 2A through FIG. 2D are sectional views illustrating a process of fabricating a SOI wafer in accordance with an embodiment of the present invention.

Referring to FIG. 2A, in accordance with an embodiment of the present invention, there is provided a device substrate 10 on which a first oxide film 11 is formed to a thickness of 500–1000 Å by thermal oxidation or a CVD method. There is also provided a base substrate 20 which is a bare Si layer. The base substrate 20 is contacted with the surface of the oxide film 11 and is then bonded to the device substrate 10 by a high pressure and high temperature heat treatment.

Figure 2B:
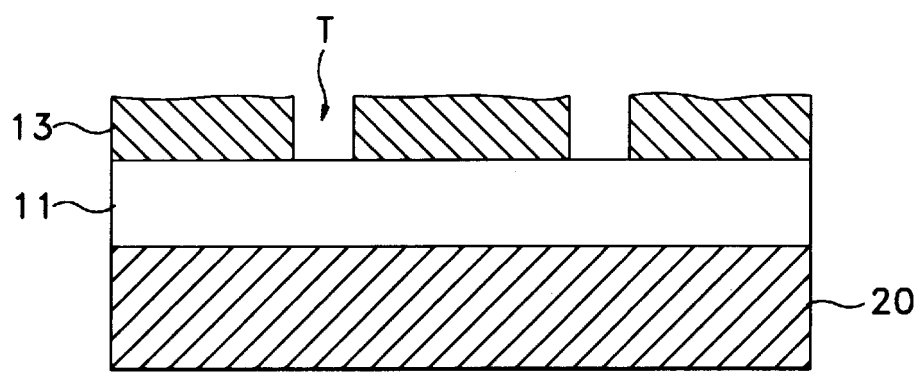

As shown in FIG. 2B, the device substrate 10 is ground by a grinding process or etched by a selective wet etching method to form a Si layer 13 having a thickness of 10–30 $\mu$m and the Si layer 13 is then polished to a thickness of less than 2 $\mu$m by a chemical and mechanical polishing ("CMP") process. At this time, the thickness of the Si layer 13 is not uniform due to a CMP process condition and total thickness variation TTV effect of the device substrate.

Figure 2C:
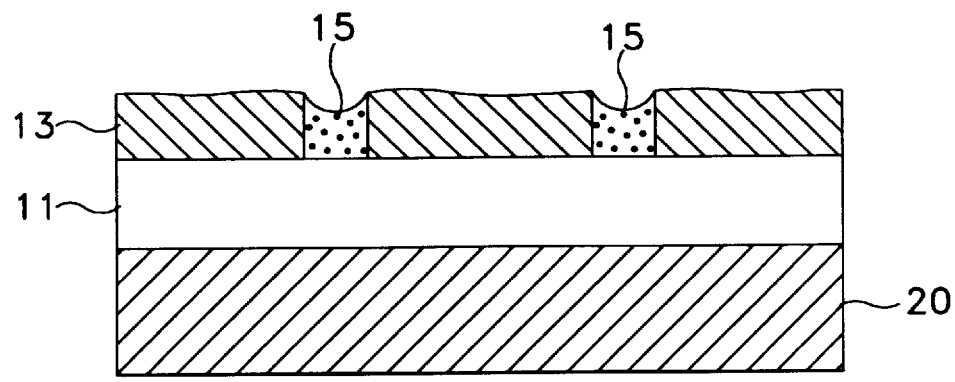

Referring to FIG. 2C, the predetermined portions of the Si layer 13 is etched to expose the oxide film 11, thereby forming trenches T. The width of each trench is preferably about 100 $\mu$m–1 mm and the width of the Si layer between adjacent trenches is preferably about 2–5 mm.

Figure 1A:
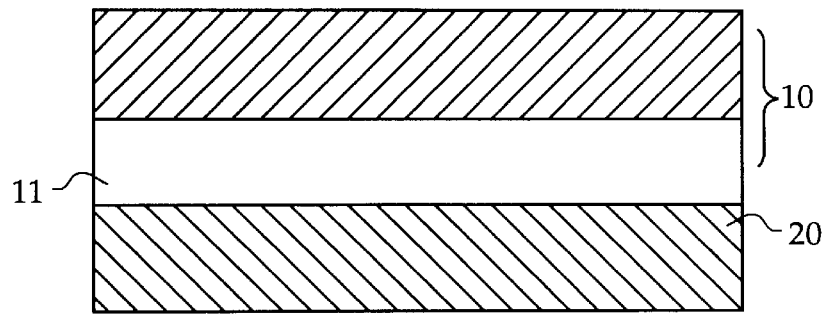
FIG. 1A through FIG. 1C are sectional views illustrating a process of fabricating a SOI wafer in the prior art.
Figure 1B:
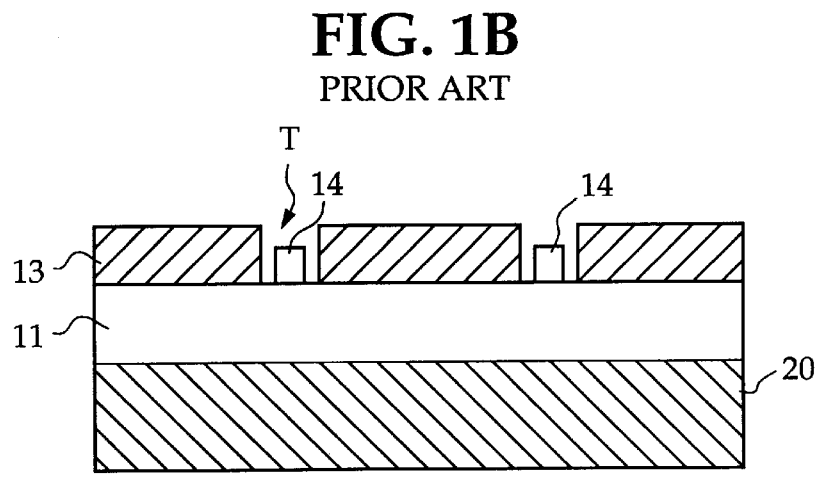
Figure 1C:
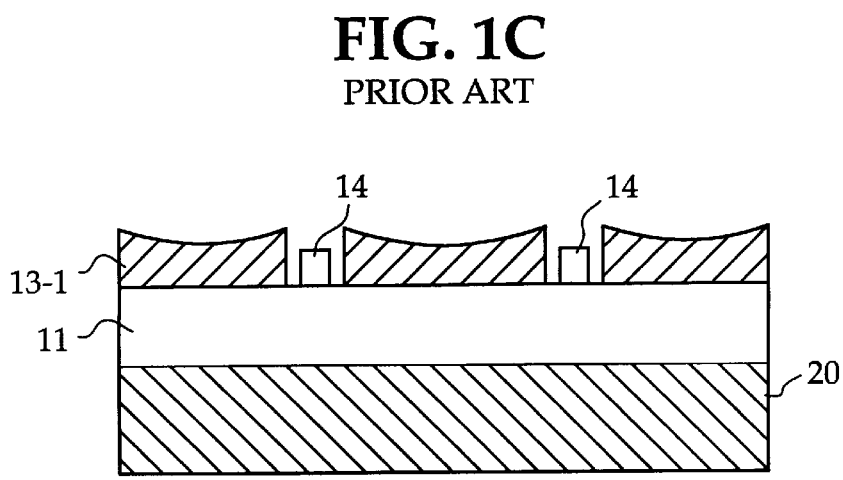

A SOG film 15 is formed in the trenches. At this time, the SOG film 15 does not completely fill the trench, but is depressed in its center portion as shown in FIG. 1C. In one embodiment, a silicate SOG film is used as the SOG film 15. The SOG film 15 is formed only in the trenches and not on the surface of the Si layer, and the thickness of the SOG film 15 at the central portion of the trench T is controlled in accordance with the number of rotations of a coating device and percent weight of the silicate type polymer contained in the SOG film. The thickness of a device formation layer which is to be formed in the following process is controlled in accordance with the thickness of the SOG film 15 at the central portion of the trench. Preferably, the thickness of the SOG film 15 is approximately 500–3000 Å.

Afterwards, the SOG film 15 is cured and baked at a temperature of preferably 400–600° C. which is lower than the conventional baking temperature of 800° C. Herein, curing or baking process of the SOG film 15 at a temperature of 400–600° C. is for a large number of silanol (Si—OH) radicals contained in the SOG film 15 to remain in inert state and is to reduce compactness of the film to carry out easily the mechanical polishing process that is to follow.

Then, the surface of the resultant is polished by a CMP process using a slurry solution. In one embodiment, the CMP process is carried out in two steps. The first step is a polishing step in case where the contact area of the SOG film 15 and a pad of a polisher is smaller than the width of the trench T. In the first step, because the SOG film 15 is contacted with the pad in a small area and is not dense due to the low temperature curing or baking process, the SOG film 15 is polished at a polishing rate similar to that of the Si layer 13, thereby nearly planarizing the surfaces of the SOG film 15 and the Si layer 13.

The second step is a polishing step in case where the contact area of the SO film 15 and a pad of a polisher become almost equal to the width of the trench T as the SOG film 15 and the Si layer 13 are polished, thus n case where it start co expose the depressed portion of the SOG film 15. In the second step, a number of silanol (Si—OH) radicals which remain in nonreaction state are exposed to the surface of the SOG film 15 and the exposed silanol radicals are dissociated into Si—O$^+$ and H$^+$, thereby increasing the proton ion concentration(H$^+$) in the slurry used in the CMP process by the dissociated H$^+$.

Figure 2D:
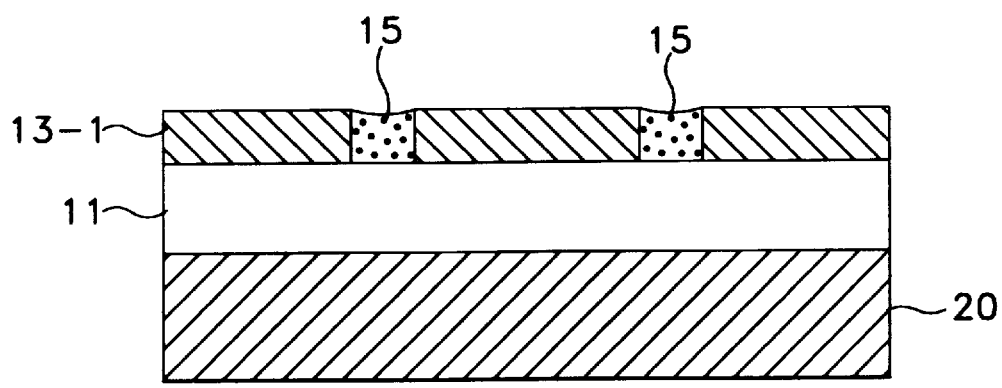

In general, the pH of the slurry used in the CMP process is controlled to an approximate pH factor of 10–11. In one embodiment, however, because Si—OH radicals remains in the SOG film 15 due to the low temperature curing or baking process, the proton ion concentration is increased by H$^+$ dissociated from the Si—OH radicals and the pH of the slurry becomes lowered. According to this phenomenon, the silica particles contained in the slurry are condensed each other to make large particles, thereby degrading the polishing characteristic. Accordingly, as the contact area of the SOG film and the polishing pad is increased, the pH of the slurry becomes lowered and the CMP process is finished. As shown in FIG. 2D, a device formation layer 13-1 is formed having a uniform thickness corresponding to that of the SOG film 15.

In this invention, a PSG film may be used which contains P as a polishing stopper. In using the PSG film as a polishing stopper, P contained in the PSG film reacts to H$_2$O contained in the slurry to generate phosphoric acid(H$_3$PO$_4$) easily. The generated H$_3$PO$_4$ with H$^+$ dissociated from the Si—OH radical reduces the pH of the slurry to form the device formation layer having a more uniform thickness.

In one embodiment, the oxide film 11 is formed on the device substrate, but it may also be formed on the base substrate.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method of fabricating a silicon-on-insulator wafer, comprising the steps of:

thinning said device substrate to form a silicon layer;

etching said silicon layer to expose a surface of said oxide film, thereby forming trenches;

forming polishing stoppers within said trenches, each polishing stopper having a smaller thickness in a center portion and a greater thickness in an outer portion;

heat-treating said polishing stopper; and polishing, via chemical and mechanical polishing, said silicon layer using said polishing stopper to form a device formation layer.

2. The method claimed in claim 1, wherein said step of thinning said device substrate includes a step of grinding said silicon layer, and polishing a ground surface of said silicon layer via mechanical and chemical polishing.

3. The method claimed in claim 1, wherein said step of thinning said device substrate includes a step of wet etching said silicon layer; and polishing a ground surface of said silicon layer via mechanical and chemical polishing.

4. The method as claimed in claim 1, wherein said device substrate is ground so that said silicon layer as a thickness of less than 2 $\mu$m.

5. The method as claimed in claim 1, wherein said trench has a width of 100 $\mu$m–1 mm.

6. The method as claimed in claim 1, wherein said Si layer between trenches has a width of 2–5 mm.

7. The method as claimed in claim 5, wherein said polishing stopper comprises a silicate SOG.

8. The method as claimed in claim 1, wherein said polishing stopper comprises a PSG containing P.

9. The method as claimed in claim 1, wherein the thickness of said silicon layer is controlled in accordance with the thickness of said polishing stopper in the center portion of said trench.

10. The method as claimed in claim 9, wherein the thickness of said polishing stopper in the center portion of the trench is 500–3000 Å.

11. The method as claimed in claim 1, wherein the step of heat-treating said polishing stopper is carried out at a temperature of 400–600° C.

12. The method as claimed in claim 1, wherein the step of providing said silicon-on-insulator wafer includes the steps of: providing said device substrate on which said oxide film is formed, and said base substrate; contacting the surface of said oxide film with a surface of said base substrate; and bonding said base substrate and said device substrate.

13. The method as claimed in claim 1, wherein the step of providing said silicon-on-insulator wafer includes the steps of providing said base substrate on which said oxide film is formed, and said device substrate; contacting the surface of said oxide film with said device substrate; and bonding said base substrate and said device substrate.

14. The method claimed in claim 1, wherein said polishing stoppers have an uncovered depression in said center portion.

15. The method claimed in claim 14, wherein said polishing stopper is made of silicate spin-on-glass (SOG).

16. The method claimed in claim 15, wherein said step of polishing includes:

using a silica particle slurry of a known pH range, curing said polishing stopper to increase the proton ion concentration by a H+ dissociated from an Si—OH radical to lower said pH of said slurry thereby degrading a polishing characteristic of said slurry which prevents a dishing effect on said silicon layer.

* * * * *

UNITED STATES PATENT AND TRADEMARK OFFICE
CERTIFICATE OF CORRECTION

PATENT NO. : 6,051,477  Page 1 of 1
DATED : April 18, 2000
INVENTOR(S) : C. Nam

It is certified that error appears in the above-identified patent and that said Letters Patent is hereby corrected as shown below:

Title page,
Item [56], References Cited, prior to line 5, please insert,
-- 5,262,346   11/1993   Bindal et al
   5,318,663   6/1994    Buti et al.
   5,399,233   3/1995    Murazumi et al. --; and
after line 10, please insert -- 0639858   2/1995   EPO --.

Column 3,
Line 19, cancel "FIG. 2C" and substitute therefor -- FIG. 2B --; and
Line 26, cancel "FIG. 1C" and substitute therefor -- FIG. 2C --.

Signed and Sealed this

Fourteenth Day of May, 2002

*Attest:*

JAMES E. ROGAN
*Attesting Officer*   Director of the United States Patent and Trademark Office